(12) United States Patent
Glenn et al.

(10) Patent No.: US 7,279,773 B2
(45) Date of Patent: Oct. 9, 2007

(54) PROTECTION DEVICE FOR HANDLING ENERGY TRANSIENTS

(75) Inventors: Jack L. Glenn, Kokomo, MI (US); Troy D. Clear, Kokomo, IN (US); Mark W. Gose, Kokomo, IN (US); John M. Dikeman, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/080,274

(22) Filed: Mar. 15, 2005

(65) Prior Publication Data

US 2006/0208340 A1  Sep. 21, 2006

(51) Int. Cl.
*H01L 31/107* (2006.01)

(52) U.S. Cl. ............... 257/605; 257/355; 257/E21.356; 361/91.5

(58) Field of Classification Search ............... 257/355, 257/603–606, 356, 481, 482, E29.014, E29.335, 257/328, 358, 359, 360, 363, E21.356; 363/52; 307/219; 148/191; 340/825.91; 361/91.5
See application file for complete search history.

(56) References Cited

U.S. PATENT DOCUMENTS

| | | | | |
|---|---|---|---|---|
| 3,601,632 A | * | 8/1971 | Frazier | 327/526 |
| 3,635,773 A | * | 1/1972 | Thire | 438/419 |
| 4,672,403 A | | 6/1987 | Jennings | |
| 5,227,781 A | * | 7/1993 | Ninnis | 340/14.63 |
| 5,612,562 A | * | 3/1997 | Siaudeau et al. | 257/328 |
| 5,756,387 A | | 5/1998 | Villa et al. | |
| 6,605,859 B1 | * | 8/2003 | Romas et al. | 257/606 |
| 2004/0179380 A1 | * | 9/2004 | Yamashita | 363/52 |

* cited by examiner

*Primary Examiner*—Minhloan Tran
*Assistant Examiner*—Benjamin Tzu-Hung Liu
(74) *Attorney, Agent, or Firm*—Jimmy L. Funke

(57) ABSTRACT

A protection device for handling energy transients includes a plurality of basic unit Zener diodes connected in series to achieve a desired breakdown voltage. Each of the basic unit Zener diodes is formed in a first-type substrate. Each of the basic unit Zener diodes comprises a second-type well formed in the substrate, a second-type Zener region formed in the second-type well and a first-type+ region formed over the second-type Zener region between a first and second second-type+ region.

20 Claims, 3 Drawing Sheets

PROTECTION DEVICE FOR HANDLING ENERGY TRANSIENTS

TECHNICAL FIELD

The present invention is generally directed to a protection device and, more specifically, to a protection device for handling energy transients.

BACKGROUND OF THE INVENTION

A wide variety of metal-oxide semiconductor field-effect transistors (MOSFETs) are utilized in motor vehicles to drive inductive loads, such as solenoids. In a typical application, a control signal, provided by a gate drive circuit, is applied across a gate and a source of a MOSFET to control energization of a solenoid that is coupled to a drain of the MOSFET. In a typical application, the control signal periodically causes the MOSFET to turn off. In this case, the gate drive circuit typically attempts to pull the MOSFET gate low to reduce the gate voltage. As the gate voltage is reduced, the MOSFET starts to turn off and the current through the MOSFET attempts to go down. However, since the inductive load coupled to the drain of the MOSFET requires a fixed current to flow for a short period of time, the drain voltage of the MOSFET rises such that the MOSFET conducts substantially the same level of current at the lower gate voltage. In this situation, if the MOSFET is not protected, the voltage across the drain and source of the MOSFET can rise to a point where the MOSFET undergoes breakdown.

To prevent the MOSFET from undergoing breakdown, a stack of Zener diodes have traditionally been connected between the gate and drain of the MOSFET (see FIG. 6, where the stack is represented by one Zener diode). When the drain-to-gate voltage reaches the breakdown voltage of the stack, the Zener diodes breakdown passing current into the gate, which, in turn, holds the gate voltage at some minimum acceptable level to allow current to flow through the inductive load. Unfortunately, in this case, the current through and the voltage across the MOSFET can reach relatively high values, resulting in high power dissipation by the MOSFET, which, in turn, can increase a temperature of the MOSFET. Thus, in a typical power MOSFET, in order for the MOSFET temperature to be kept below a critical value, the size of the MOSFET may be required to be relatively large. In the case where the device is physically larger than required to reach a specified maximum on-resistance, the device is said to be thermally limited.

What is needed is a technique for protecting a semiconductor device from energy transients that generally does not require the physical size of the device to be larger than that required to reach a specified maximum on-resistance.

SUMMARY OF THE INVENTION

The present invention is directed to a protection device for handling energy transients that includes a plurality of basic unit Zener diodes connected in series to achieve a desired breakdown voltage. Each of the basic unit Zener diodes is formed in a first-type substrate. Each of the basic unit Zener diodes comprises a second-type well formed in the substrate, a second-type Zener region formed in the second-type well and a first-type+ region formed over the second-type Zener region between a first second-type+ region and a second second-type+ region. According to another aspect of the invention, the relationship between the second-type Zener region and the first-type+ region is such that the breakdown only occurs below an upper surface of the substrate.

According to a different aspect of the present invention, the device further includes a plurality of first-type+ channel stops formed in the substrate. According to this aspect of the invention, the channel stops are shorted to a cathode of the device. According to another embodiment of the present invention, each of the basic unit Zener diodes has a breakdown voltage in the range of about 4 Volts to about 8 Volts. According to another aspect of the invention, each of the basic unit Zener diodes has a breakdown voltage in the range of 6.0 Volts to 6.5 Volts.

According to another embodiment of the present invention, the device includes at least eight basic unit Zener diodes connected in series to form a stack. According to this aspect of the invention, the device may include a plurality of stacks coupled in parallel to achieve a desired current handling capacity.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to the present invention, a protection device (Zener diode) is described herein that includes a plurality of unit Zener diodes 109 (see FIGS. 2-5) coupled in series to form a stack. It should be appreciated that numerous stacks may be utilized in parallel combination to achieve a desired current handling capability. The unit Zener diodes have a fixed breakdown voltage, fixed resistance, power dissipation and similar noise characteristics. In general, the unit Zener diode is a junction-isolated buried Zener structure, which causes substantially all of the breakdown to occur below the surface of the semiconductor device. The Zener diode described herein is particularly advantageous when implemented to prevent a power metal-oxide semiconductor field-effect transistor (MOSFET) from having to absorb energy delivered from an associated inductive load.

Figure 7:
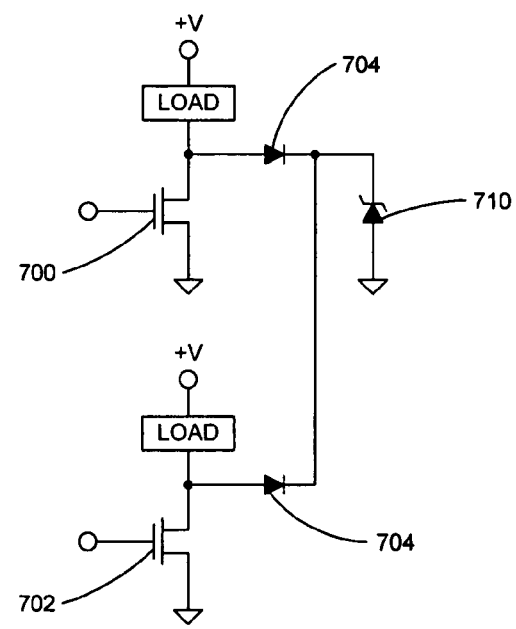
FIG. 7 is an electrical schematic of a protection scheme, according to the present invention.

According to the present invention, a cathode of the Zener diode is coupled to a drain of the MOSFET and an anode of the Zener diode is connected to a source of the MOSFET. In general, the breakdown voltage of the Zener diode is designed to be lower than the breakdown voltage of the power MOSFET that the Zener diode is designed to protect, such that the Zener diode turns on before the MOSFET, when energy from an inductive load is discharged into the drain of the MOSFET. The Zener diode is designed to have a sufficiently low resistance, such that the total voltage reached by the Zener diode during an inductive event is below the breakdown voltage of the MOSFET. It should be appreciated that a Zener diode designed according to the present invention can absorb the energy of multiple inductive loads at the same time (see FIG. 7). This can be achieved by connecting a drain of each MOSFET to an anode of a pass diode. A cathode of each pass diode is then coupled to a cathode of the Zener diode, whose anode is coupled to the sources of the MOSFETs. In this configuration, it should be appreciated that, the Zener diode is required to be sized such that it can absorb the energy from multiple inductive events simultaneously.

As is discussed above, a Zener diode designed according to the present invention is composed of a series of unit Zener diodes 109 (see FIGS. 2-5) connected in, for example, metal. Each unit diode has a value, which is appropriate for a low sub-breakdown leakage, a low band-to-band tunneling current and, which, when in Zener breakdown mode, does not produce a negative differential voltage during breakdown of more than about 1 mV. In this case, a stack of eight unit Zener diodes would exhibit less than about 8 mV of ringing on the inductive transient waveform. Assuming these requirements are met, the Zener diode produces low signal noise, when switched through the breakdown region. In general, these constraints practically limit the unit Zener diode to a breakdown voltage of about 4 Volts to about 8 Volts. For example, the unit Zener diode may have a breakdown voltage in the range of about 6.0 Volts to about 6.5 Volts. The breakdown voltage of each of the unit Zener diodes is then added together to provide an overall desired breakdown voltage for a specific application. For example, for a target application having a voltage range of 48 to 56 Volts, a stack of eight or nine unit Zener diodes may be utilized. It should be appreciated that the target voltages specified herein are for illustration only. That is, the protection device can be configured to reach practically any value that is an increment of the value of the unit Zener diodes.

In a typical application, a series stack of eight or nine unit diodes are laid out in a parallel finger configuration on a single discrete chip. The anode and cathode of the Zener diode is then pinned out using either solder bumps or wire bonds. In a typical application, the Zener diode chip may be assembled on a circuit board next to a semiconductor device that the Zener diode is to protect. In a typical situation, the MOSFET (or switch in general) will have its drain connected to an inductive load. As briefly mentioned above, the drain of the MOSFET may also be connected to an anode of a pass diode that exhibits a high-reverse breakdown such that the pass diode does not break down in a reverse direction, under normal conditions. The cathode of the pass diode is then routed to a cathode of the Zener diode described herein, whose anode is coupled to a source of the switch. In this manner, when one or more of the MOSFETs experience an inductive kickback, the drain voltage of the MOSFET will rise to maintain the current flow through the inductor and, when the drain voltage of the MOSFET reaches the breakdown voltage of the Zener diode, the pass diode is forward biased and the inductive current is provided off chip to the Zener diode.

With reference to FIGS. 1-5, protection devices 400 and 500 constructed according to one embodiment of the present invention include a plurality of P-type wells 104 formed in an N-type substrate 102. The P-type wells 104 may be thermally driven and the N-type substrate 102 may have a (100) Miller indice with a resistivity of about 1.5 Ohms-centimeter. While the discussion herein is directed to P-type wells and an N-type substrate, it should be appreciated that the types of the wells and substrate may be reversed. In this case, the other regions, discussed below, would also be reversed in type. As used herein, the terms "first-type" and "second-type" refer to opposite types. For example, if the first-type is N-type then the second-type is P-type. As is well know to those of ordinary skill in the art, an N-type semiconductor material is a semiconductor material in which the predominant charge carriers are electrons and an P-type semiconductor material is a semiconductor material in which the predominant charge carriers are holes (positive charges). As used herein a + sign indicates very heavy doping approaching the solid solubility limit. For example, a N+ region is a N-type region where the doping approaches the solid solubility region.

Figure 1:
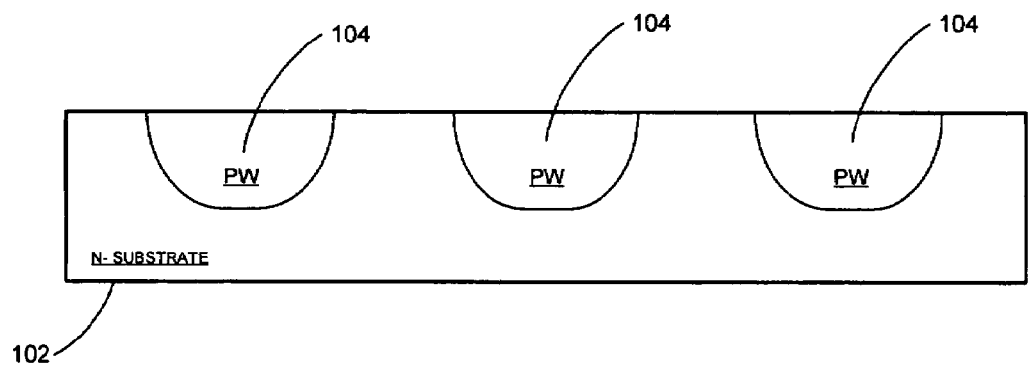
FIG. 1 is a cross-sectional view of a portion of an exemplary protection device, constructed according to the present invention.
Figure 2:
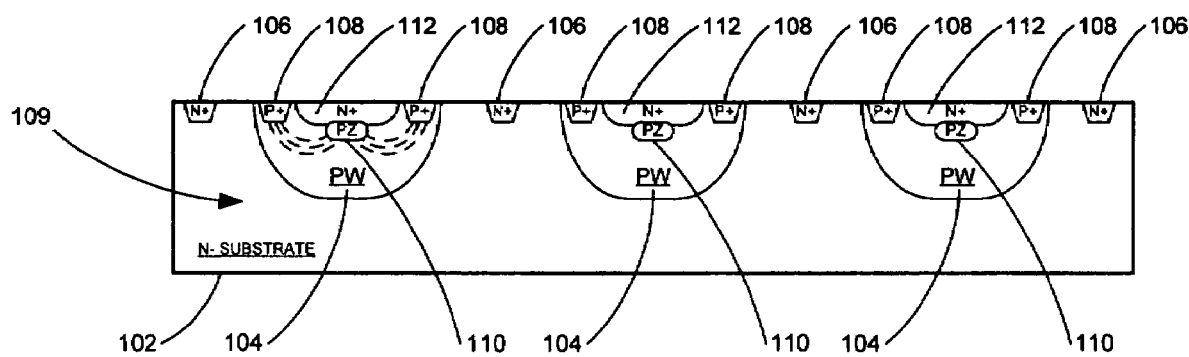
FIG. 2 is a cross-sectional view of another portion of an exemplary protection device, constructed according to the present invention.

With specific reference to FIG. 2, each of the P-type wells 104 includes a P-type Zener (PZ) region 110 and an N+ region 112 formed over the PZ region 110. As is shown, the N+ region 112 is formed between a first P+ region and a second P+region 108. According to the present invention, the device is designed such that the relationship between the PZ region 110 and the N+ region 112 is such that breakdown only occurs below an upper surface of the substrate 102. As is also shown in FIG. 2, a plurality of N+ channel stops 106 are formed in the substrate 102, between the P-type wells 104. As is described further below, the channel stops 106 may be shorted to a cathode of the device.

Figure 3:
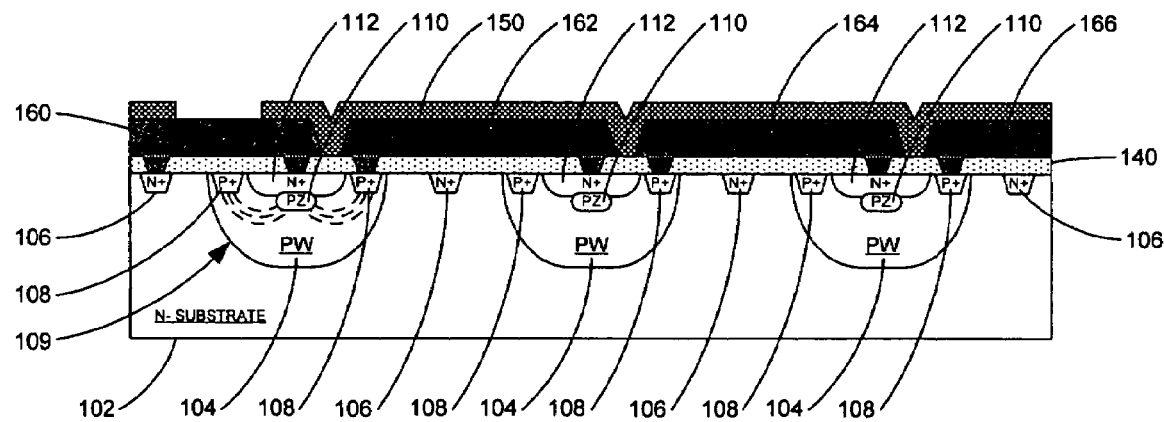
FIG. 3 is a cross-sectional view of the device of FIG. 2, including additional layers.

With reference to FIG. 3, an oxide layer 140 includes a plurality of windows formed therein to allow metalizations 160, 162, 164 and 166 of a metal layer to contact appropriate portions of the device. More specifically, metallization 160 contacts the leftmost channel stop 106 and the leftmost N+ region (cathode) 112, formed in the first (i.e., leftmost) P-type well 104. The metallization 162 connects the rightmost P+ region (anode) 108 formed in the first P-type well 104 to the N+ region (cathode) 112 formed in the second (i.e., center) P-type well 104. The metallization 164 connects the rightmost P+ region (anode) 108 formed in the second P-type well 104 to the N+ region (cathode) 112 formed in the third (i.e., rightmost) P-type well 104. The rightmost P+ region (anode) 108 formed in the third P-type well 104 is coupled to an N+ region (cathode) formed in a next P-type well (not shown). As is also shown in FIG. 3, an oxide layer 150 is formed over the metal layer, i.e., metalizations 160, 162, 164 and 166.

Figure 4:
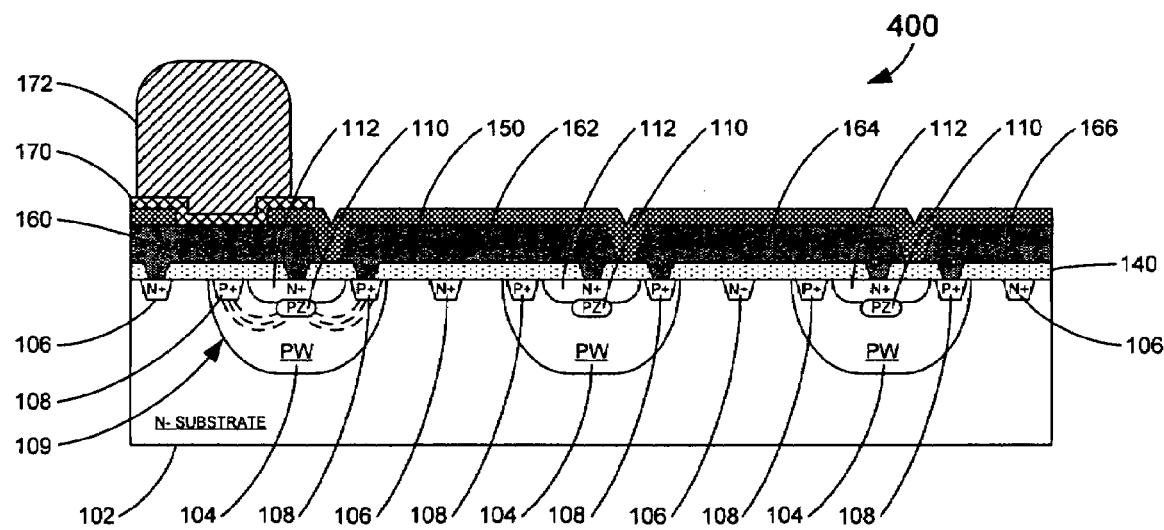
FIG. 4 is a cross-sectional view of the device of FIG. 3, including a solder bump.
Figure 5:
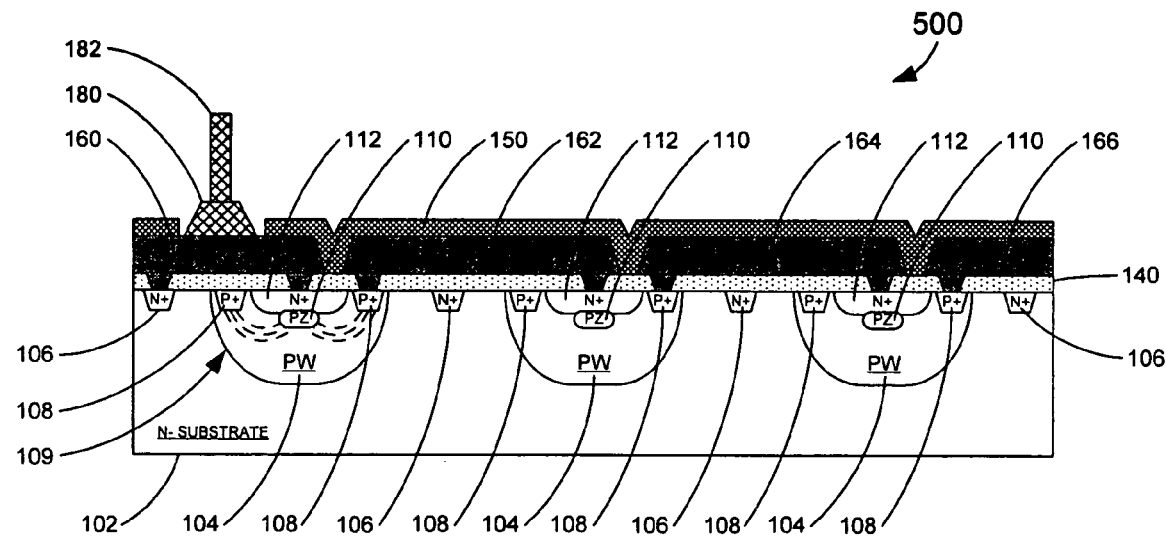
FIG. 5 is a cross-sectional view of the device of FIG. 3, including a wire bond.
Figure 6:
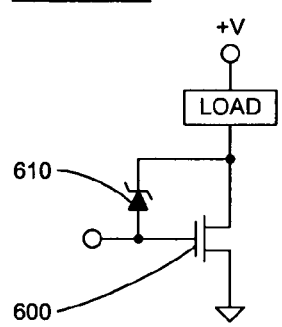
FIG. 6 is an electrical schematic of an exemplary protection scheme, according to the prior art.

With specific reference to FIG. 4, a protection device 400 includes a solder bump 172 electrically coupled to cap metal 170, which is electrically coupled to the metallization 160. With specific reference to FIG. 5, a protection device 500 is shown with the metallization 160 bonded to a bond wire 182, by a ball bond or stitch bond 180. With reference to FIG. 6, a Zener diode, constructed according to the prior art, is shown coupled between a drain and a gate of a MOSFET 600. A drain of the MOSFET 600 is coupled to a first side of a low side of an inductive load and a high side of the load is coupled to a power supply +V.

According to the prior art, when the breakdown voltage of Zener diode 610, which is designed to be lower than the breakdown voltage of the MOSFET 600, is exceeded, the Zener diode 610 turns on causing the MOSFET 600 to turn on hard. As is described above, this holds a gate voltage at some minimum acceptable value to allow current to flow into the inductive load. However, as described above, the current through and the voltage across the MOSFET 600 may reach relatively high values, which can cause the MOSFET 600 to reach relatively high temperatures. This, in turn, may require that the MOSFET 600 be relatively large in order to be able to handle the power dissipation.

With reference again to FIG. 7, the Zener diode 710, constructed according to an embodiment of the present invention, is coupled to a drain of MOSFETs 700 and 702, via the pass diodes 704. As mentioned above, when the voltage at the drain of the MOSFETs 700 and 702 reaches an approximate breakdown voltage of the Zener diode 710, the pass diodes 704 conduct and, thus, the Zener diode 710 carries the transient to ground, instead of requiring the MOSFETs 700 and 702 to dissipate the power. This allows MOSFETs 700 and 702 to have a smaller area and, thus, avoids the need for the utilization of MOSFET having larger areas than is required for a specified design maximum on-resistance.

It should be appreciated that a protection device constructed according to the present invention may be achieved through a number of different semiconductor processes. For example, when an N-type substrate is utilized as the starting material, a thermal or chemical vapor deposition (CVD) oxide may be utilized. The oxide is masked and P-type implants are thermally driven to create an appropriate number of deep P-type wells (e.g., about 4 microns deep), depending upon the number of unit Zener diodes required for the application. The oxide is then stripped and a screen oxide is grown. The screen oxide is then masked and the PZ diffusion are then implanted (e.g., about 1 micron deep). Then, the screen oxide is masked for the N+ and P+ regions. The N+ and P+ regions are then implanted (e.g., about 0.3 microns deep). In general, the N+ region is doped significantly heavier than the PZ region such that the surface is N+. The PZ region should generally be drawn to be completely enclosed by the N+ region to ensure that breakdown of the PZ region only occurs below the surface and is therefore buried and drift free for the life of the device, which, in turn, provides a device with a stable breakdown voltage for the life of the device.

In general, the device is particularly useful for inductive load applications as it exhibits little or no negative differential voltage during breakdown conditions, e.g., the negative differential voltage of the device is less than about 1 mV. This device characteristic reduces and/or prevents ringing (oscillations) in the breakdown waveform. The device also exhibits low band-to-band tunneling current leakage such that at a high temperature, e.g., 150° C., the off-state leakage is sufficiently low for automotive applications, e.g., the leakage current is less than about 3 nA/mil$^2$.

A plurality of N+ channel stops (e.g., about 0.3 microns deep), which are shorted to a cathode of the unit Zener diodes, are also placed in the field areas to act as channel stops. Next, a dielectric, e.g., a 5 k low-temperature oxide (LTO), is deposited. The dielectric is then patterned and contact holes are etched through the dielectric. Then, one or more thick metal layers are deposited. The metal layer or layers are then patterned and etched. Next, a passivation layer is deposited on the metal layer. The passivation layer is then patterned and etched to provide contact to the underlying unit Zener diodes. Cap metal and solder bumps are then located in active areas. Alternatively, the active areas may be wire bonded.

Accordingly, a protection device has been described herein that includes an application appropriate number of basic unit Zener diodes (e.g., in series and parallel combination), which advantageously allow for the reduction in size of an associated MOSFET. This is particularly advantageous in the automotive industry, which increasingly requires economical power MOSFETs to switch various inductive loads.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A protection circuit for MOSFETS driving inductive loads, comprising:

a plurality of independently switched MOSFETs each having a source and a drain connected in series with a separate inductive load;

a plurality of basic unit Zener diodes connected in series to form a stacked Zener diode external of the MOSFETs, the stacked Zener diode having a cathode and an anode and having a desired breakdown voltage less than the breakdown voltages of the MOSFETs, wherein each of the basic unit Zener diodes is formed in a first-type substrate, and wherein each of the basic unit Zener diodes comprises:

a second-type well formed in the substrate;

a second-type Zener region formed in the second-type well; and a first-type+ region formed over the second-type Zener region between a first and second second-type+ region, wherein the drain of each of the plurality of MOSFETs is coupled through a separate pass diode to the cathode of the stacked Zener diode and the source of each of the plurality of MOSFETs is coupled to a point of common potential with the anode of the stacked Zener diode, each of the pass diodes having a cathode connected to the cathode of the stacked Zener diode.

2. The circuit of claim 1, wherein the relationship between the second-type Zener region and the first-type+ region is such that breakdown only occurs below an upper surface of the substrate.

3. The circuit of claim 1, further comprising:

a plurality of first-type+ channel stops formed in the substrate, wherein the channel stops are shorted to the cathode of the stacked Zener diode.

4. The circuit of claim 1, wherein each of the basic unit Zener diodes has a breakdown voltage in the range of about 4 Volts to about 8 Volts.

5. The circuit of claim 4, wherein each of the basic unit Zener diodes has a breakdown voltage in the range of about 6.0 Volts to about 6.5 Volts.

6. The circuit of claim 1, wherein the stacked Zener diode includes at least eight basic unit Zener diodes connected in series to form a stack.

7. The circuit of claim 6, wherein the stacked Zener diode includes a plurality of the stacks coupled in parallel to achieve a desired current handling capacity.

8. A protection circuit for MOSFETS driving inductive loads, comprising:

a plurality of independently switched MOSFETs each having a source and a drain connected in series with a separate inductive load;

a plurality of basic unit Zener diodes connected in series to form a stacked Zener diode external of the MOS- FETs, the stacked Zener diode having a cathode and an anode and having a desired breakdown voltage less than the breakdown voltages of the MOSFETs wherein each of the basic unit Zener diodes is formed in an N-type substrate, and wherein each of the basic unit Zener diodes comprises:

a P-type well formed in the substrate;

a P-type Zener region formed in the P-type well; and an N+ region formed over the P-type Zener region between a first and second P+ region wherein the drain of each of the plurality of MOSFETS is coupled through a separate pass diode to the cathode of the stacked Zener diode and the source of each of the plurality of MOSFETs is coupled to a point of common potential with the anode of the stacked Zener diode, each of the pass diodes having a cathode connected to the cathode of the stacked Zener diode.

9. The circuit of claim 8, wherein the relationship between the P-type Zener region and the N+ region is such that breakdown only occurs below an upper surface of the substrate.

10. The circuit of claim 8, further comprising:

a plurality of N+ channel stops formed in the substrate, wherein the channel stops are shorted to the cathode of the stacked Zener diode.

11. The circuit of claim 8, wherein each of the basic unit Zener diodes has a breakdown voltage in the range of about 4 Volts to about 8 Volts.

12. The circuit of claim 11, wherein each of the basic unit Zener diodes has a breakdown voltage in the range of about 6.0 Volts to about 6.5 Volts.

13. The circuit of claim 8, wherein the stacked Zener diode includes at least eight basic unit Zener diodes connected in series to form a stack.

14. The circuit of claim 13, wherein the stacked Zener diode includes a plurality of the stacks coupled in parallel to achieve a desired current handling capacity.

15. A protection circuit for MOSFETS driving inductive loads, comprising:

a plurality of independently switched MOSFETs each having a source and a drain connected in series with a separate inductive load;

a plurality of basic unit Zener diodes connected in series to form a stacked Zener diode external of the MOSFETs, the stacked Zener diode having a cathode and an anode and having a desired breakdown voltage less than the breakdown voltages of the MOSFETs, wherein each of the basic unit Zener diodes is formed in an N-type substrate, and wherein each of the basic unit Zener diodes comprises:

a P-type well formed in the substrate;

a P-type Zener region formed in the P-type well; and an N+ region formed over the P-type Zener region between a first and second P+ region, wherein each of the basic unit Zener diodes has a breakdown voltage in the range of about 4 Volts to about 8 Volts and wherein the drain of each of the plurality of MOSFETs is coupled through a separate pass diode to the cathode of the stacked Zener diode and the source of each of the plurality of MOSFETs is coupled to a point of common potential with the anode of the stacked Zener diode, each of the pass diodes having a cathode connected to the cathode of the stacked Zener diode.

16. The circuit of claim 15, wherein the relationship between P-type Zener region and the N+ region is such that breakdown only occurs below an upper surface of the substrate.

17. The circuit of claim 15, further comprising:

a plurality of N+ channel stops formed in the substrate, wherein the channel stops are shorted to the cathode of the stacked Zener diode.

18. The circuit of claim 15, wherein each of the basic unit Zener diodes has a breakdown voltage in the range of about 6.0 Volts to about 6.5 Volts.

19. The circuit of claim 15, wherein the stacked Zener diode includes at least eight basic unit Zener diodes connected in series to form a stack.

20. The circuit of claim 19, wherein the stacked Zener diode includes a plurality of the stacks coupled in parallel to achieve a desired current handling capacity.

* * * * *